(12) United States Patent
Seo et al.

(10) Patent No.: US 8,930,168 B2
(45) Date of Patent: *Jan. 6, 2015

(54) TRIMMING OF OPERATIVE PARAMETERS IN ELECTRONIC DEVICES BASED ON CORRECTIONS MAPPINGS

(71) Applicant: Hynix Semiconductor Inc., Kyoungki-Do (KR)

(72) Inventors: Donghyun Seo, Seoul (KR); Kijun Nam, Seoul (KR); Seokseong Yoon, Incheon (KR)

(73) Assignee: SK Hynix Inc., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/791,836

(22) Filed: Mar. 8, 2013

(65) Prior Publication Data

US 2013/0181761 A1   Jul. 18, 2013

Related U.S. Application Data

(62) Division of application No. 12/970,771, filed on Dec. 16, 2010, now Pat. No. 8,447,571, which is a division of application No. 11/881,507, filed on Jul. 27, 2007, now Pat. No. 7,877,236.

(30) Foreign Application Priority Data

Jul. 27, 2006   (EP) ..................... 06117967

(51) Int. Cl.
*H04B 15/00*   (2006.01)
*H03K 5/08*   (2006.01)
*G01R 31/30*   (2006.01)
*G01R 31/3183*   (2006.01)

(52) U.S. Cl.
CPC ................ *H03K 5/086* (2013.01); *G01R 31/30* (2013.01); *G01R 31/3004* (2013.01); *G01R 31/318357* (2013.01)
USPC ........................... 702/189; 702/107; 702/124

(58) Field of Classification Search
USPC .......... 702/107, 124, 126, 189; 327/100, 276, 327/374
See application file for complete search history.

(56) References Cited

U.S. PATENT DOCUMENTS

| | | | | |
|---|---|---|---|---|
| 5,420,515 A | * | 5/1995 | Uhling et al. | 324/601 |
| 6,087,892 A | * | 7/2000 | Burr | 327/534 |
| 8,447,571 B2 | * | 5/2013 | Seo et al. | 702/189 |

* cited by examiner

*Primary Examiner* — Elias Desta
(74) *Attorney, Agent, or Firm* — Kevin D. Jablonski; Lane Powell PC (57) ABSTRACT

An embodiment of an electronic device having a plurality of trimmable operative parameters is provided. The electronic device includes a trimming circuit for applying a plurality of trimming actions to each parameter for causing a corresponding correction of the parameter, for at least one reference parameter, a measuring circuit for measuring the reference parameter responsive to the application of at least part of the trimming actions, and for forcing the application of the selected trimming action for the reference parameter. For each non-reference parameter different from the at least one reference parameter, the electronic device includes a selection circuit for selecting one of the trimming actions for the non-reference parameter corresponding to the selected trimming action for the at least one reference parameter, and a biasing circuit for forcing the application of the selected trimming action for each non-reference parameter.

20 Claims, 9 Drawing Sheets

| | | |
|---|---|---|
| -28% | $VC(i)^{-7} = 0111$ | $TA(i)^{-7}$ |
| -24% | $VC(i)^{-6} = 0110$ | $TA(i)^{-6}$ |
| -20% | $VC(i)^{-5} = 0101$ | $TA(i)^{-5}$ |
| -16% | $VC(i)^{-4} = 0100$ | $TA(i)^{-4}$ |
| -12% | $VC(i)^{-3} = 0011$ | $TA(i)^{-3}$ |
| -8% | $VC(i)^{-2} = 0010$ | $TA(i)^{-2}$ |
| -4% | $VC(i)^{-1} = 0001$ | $TA(i)^{-1}$ |
| 0% | $VC(i)^{0} = 0000$ | $TA(i)^{0}$ |
| +4% | $VC(i)^{1} = 1000$ | $TA(i)^{1}$ |
| +8% | $VC(i)^{2} = 1001$ | $TA(i)^{2}$ |
| +12% | $VC(i)^{3} = 1010$ | $TA(i)^{3}$ |
| +16% | $VC(i)^{4} = 1011$ | $TA(i)^{4}$ |
| +20% | $VC(i)^{5} = 1100$ | $TA(i)^{5}$ |
| +24% | $VC(i)^{6} = 1101$ | $TA(i)^{6}$ |
| +28% | $VC(i)^{7} = 1110$ | $TA(i)^{7}$ |
| +32% | $VC(i)^{8} = 1111$ | $TA(i)^{8}$ |

| | | |
|---|---|---|
| -28% | $VC(i)^{-7} = 0111$ | $TA(i)^{-7}$ |
| -24% | $VC(i)^{-6} = 0110$ | $TA(i)^{-6}$ |
| -20% | $VC(i)^{-5} = 0101$ | $TA(i)^{-5}$ |
| -16% | $VC(i)^{-4} = 0100$ | $TA(i)^{-4}$ |
| -12% | $VC(i)^{-3} = 0011$ | $TA(i)^{-3}$ |
| -8% | $VC(i)^{-2} = 0010$ | $TA(i)^{-2}$ |
| -4% | $VC(i)^{-1} = 0001$ | $TA(i)^{-1}$ |
| 0% | $VC(i)^{0} = 0000$ | $TA(i)^{0}$ |
| +4% | $VC(i)^{1} = 1000$ | $TA(i)^{1}$ |
| +8% | $VC(i)^{2} = 1001$ | $TA(i)^{2}$ |
| +12% | $VC(i)^{3} = 1010$ | $TA(i)^{3}$ |
| +16% | $VC(i)^{4} = 1011$ | $TA(i)^{4}$ |
| +20% | $VC(i)^{5} = 1100$ | $TA(i)^{5}$ |
| +24% | $VC(i)^{6} = 1101$ | $TA(i)^{6}$ |
| +28% | $VC(i)^{7} = 1110$ | $TA(i)^{7}$ |
| +32% | $VC(i)^{8} = 1111$ | $TA(i)^{8}$ |

| | | |
|---|---|---|
| −30% | $VC(o)^{-3} = 011$ | $TA(o)^{-3}$ |
| −20% | $VC(o)^{-2} = 010$ | $TA(o)^{-2}$ |
| −10% | $VC(o)^{-1} = 001$ | $TA(o)^{-1}$ |
| 0% | $VC(o)^{0} = 000$ | $TA(o)^{0}$ |
| +10% | $VC(o)^{1} = 100$ | $TA(o)^{1}$ |
| +20% | $VC(o)^{2} = 101$ | $TA(o)^{2}$ |
| +30% | $VC(o)^{3} = 110$ | $TA(o)^{3}$ |
| +40% | $VC(o)^{4} = 111$ | $TA(o)^{4}$ |

| | | |
|---|---|---|
| −25% | $VC(o)^{-1} = 01$ | $TA(o)^{-1}$ |
| 0% | $VC(o)^{0} = 00$ | $TA(o)^{0}$ |
| +25% | $VC(o)^{1} = 10$ | $TA(o)^{1}$ |

# TRIMMING OF OPERATIVE PARAMETERS IN ELECTRONIC DEVICES BASED ON CORRECTIONS MAPPINGS

PRIORITY CLAIM

The present application is a divisional of U.S. patent application Ser. No. 12/970,771, filed Dec. 16, 2010, which is a divisional of U.S. patent application Ser. No. 11/881,507, filed Jul. 27, 2007, which is now U.S. Pat. No. 7,877,236 granted Jan. 25, 2011, which claims priority from European patent application No. EP06117967, filed Jul. 27, 2006. These applications are incorporated herein by reference in their entireties.

TECHNICAL FIELD

An embodiment of the present disclosure relates to the electronics field. More specifically, an embodiment of the disclosure relates to the trimming of electronic devices.

BACKGROUND

Producing electronic devices—and especially Integrated Circuits (ICs)—is a very complex task, which involves several phases. In general terms, starting from an IC architectural design, the required electronic circuit blocks are designed and simulated by means of CAD tools; then, a physical layout of several different IC layers is defined, and corresponding photolithographic masks (necessary for the planar technology manufacturing process) are fabricated. Once the masks are released, prototypes of the IC are created, and a testing phase is carried out to check whether the IC correctly performs the intended tasks and satisfies the design requirements.

However, during the actual manufacturing of the IC, there are a number of functional parameters (voltages, currents, time delays, resistance and capacitance values) that, despite careful design and simulation, are subjected to variations of their actual values with respect to the intended, expected ones. This is mainly due to the practical and, in some respects even theoretical, impossibility of eliminating fluctuations in several parameters of the manufacturing process (e.g., dopant species concentrations, alignment of masks, and a number of other variables).

As a consequence to this unavoidable, statistical variations in their functional parameters, several of the manufactured ICs may have to be discarded because they do not respect the intended specifications.

In order to avoid this, which could severely impact the manufacturing process yield, IC designers usually provide trimming structures in the ICs, being adapted to implement a post-manufacturing correction of at least the most critical functional parameters.

Several ways are possible for implementing the trimming process of these functional parameters, such as the provision of fuses to be selectively burnt. A more usual and preferred way calls for providing (trimming) configuration registers, usually programmable electrically and capable of retaining information even in absence of power supply. By storing prescribed configuration codes in these registers, different operating configurations for selected circuit blocks can be achieved, so as to correct the desired functional parameters at will.

Typically, this kind of trimming process is performed during the testing phase of the IC, and it can be expediently exploited not only for ensuring that a specific IC satisfies the desired requirements, but also as investigation means; in this way, IC designers and process engineers can refine the design and the process flow with the aim at coming to a consolidated product.

However, the trimming process described above is quite time consuming, since it requires measuring and accordingly correcting each functional parameter of interest individually. Moreover, the measuring of specific functional parameters may be difficult, if not impossible; for example, when a functional parameter is not directly available outside the IC it is necessary to provide additional circuitry dedicated to this purpose (which additional circuitry increases the size and the complexity of the whole IC).

A solution for alleviating the above-described drawbacks in a very specific situation is disclosed in the European Patent Application EP 1591858, which is incorporated by reference. Particularly, this document relates to the trimming of reference-voltage generators (for example, of the band-gap type). In this case, the above-described measuring and correcting operations are applied to a single reference-voltage generator only; the other reference-voltage generators are corrected in a proportional way (exploiting the fact that the fluctuations in the manufacturing process affect all the reference-voltage generators in a similar way). In this way, the trimming process of the reference-voltage generators is simplified.

However, the proposed solution is not of general applicability. Particularly, this technique does not solve the problem of measuring other functional parameters; as mentioned above, this problem is particular acute when the functional parameters are not directly available outside the IC.

Moreover, the document EP 1591858 does not cope with the additional problem of trimming the functional parameters with different accuracy. Indeed, in the solution disclosed in this document to each correction applied to the (measured) reference voltage corresponds a proportional correction for each other (non-measured) reference voltage; as a consequence, all the reference voltage generators are always trimmed in the same way. Therefore, it is not possible to discriminate functional parameters requiring different trimming processes (for example, because their accuracy is more or less critical for the operation of the IC).

SUMMARY

In its general terms, an embodiment of the present disclosure is based on the idea of implementing a many-to-one mapping of the corrections.

More specifically, an embodiment of the disclosure provides an electronic device; the electronic device has a plurality of operative parameters. The electronic device includes means for applying a plurality of trimming actions to each parameter (for causing a corresponding correction of the parameter). For at least one reference parameter, means is provided for measuring the reference parameter responsive to the application of the trimming actions (or a part thereof), in order to select one of the trimming actions that provides a target value of the reference parameter. Further means is used for forcing the application of the selected trimming action for the reference parameter. For each non-reference parameter— different from the reference parameter(s)—means is provided for selecting one of the trimming actions for the non-reference parameter corresponding to the selected trimming action for the reference parameter(s); the selection is performed according to a predetermined mapping of each group of multiple corrections of the reference parameter(s) on a single correction of the non-reference parameter. The electronic device further includes means for forcing the application of the selected trimming action for each non-reference parameter.

In an embodiment of the disclosure, a code—indicative of the corresponding selected trimming action—is stored for each reference parameter; the code(s) is/are then converted into another code being indicative of the selected trimming action for each non-reference parameter.

In an embodiment of the disclosure, a single reference parameter is used.

In this case, the mapping is based on a predefined relationship between the corrections for the reference parameter and the corrections for the non-reference parameter.

In another embodiment of the disclosure, multiple reference parameters are used.

In this case, the mapping is instead defined by combining the corrections for the reference parameters according to another relationship with the corrections for the non-reference parameter.

In one or more embodiments of the disclosure, the relationship is preferably linear.

Typically, the trimming action for each non-reference parameter is determined by approximation.

A suggested choice for the reference parameter(s) consists of a characteristic of a clock signal of the electronic device (such as its period).

It may be that the non-reference parameters cannot be measured from outside the electronic device.

BRIEF DESCRIPTION OF THE DRAWINGS

One or more embodiments of the disclosure, as well as further features and the advantages thereof, will be best understood with reference to the following detailed description, given purely by way of a non-restrictive indication, to be read in conjunction with the accompanying drawings, in which.

DETAILED DESCRIPTION

Figure 1A:
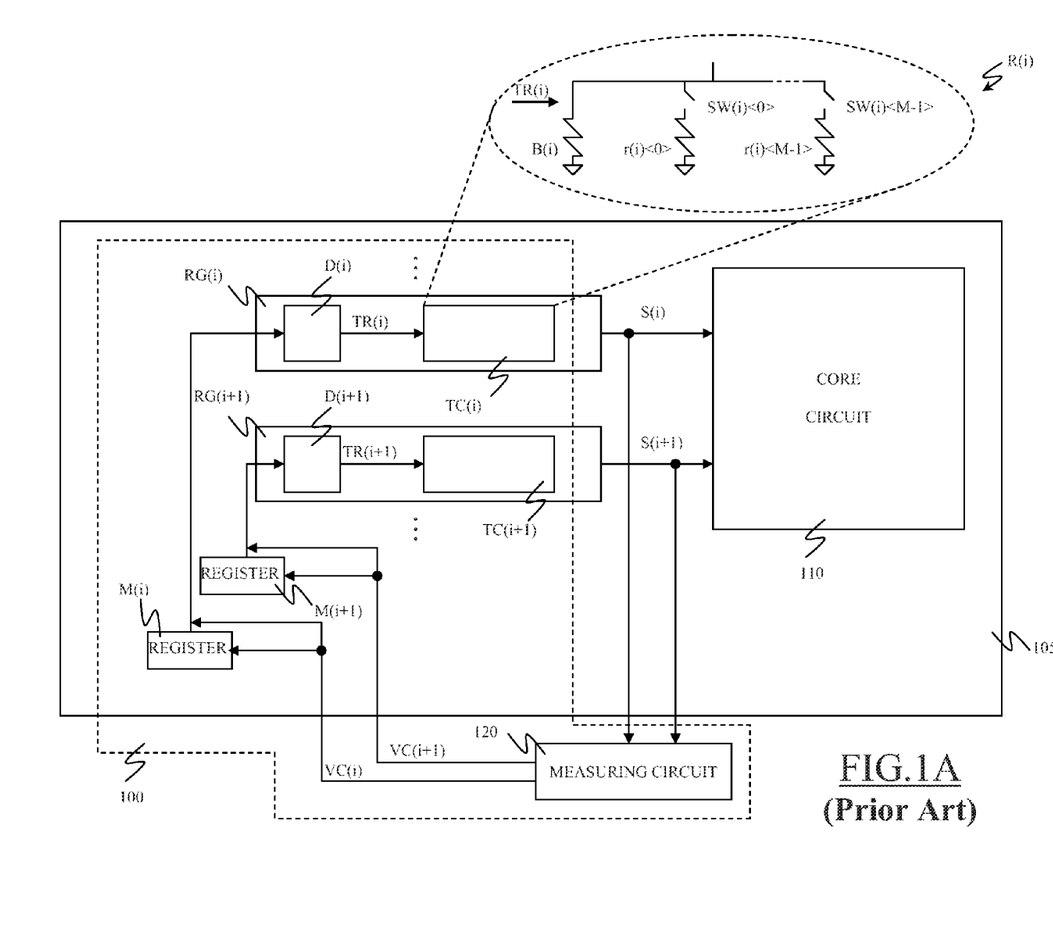
FIG. 1A shows the functional blocks of a trimming structure known in the art.

With reference in particular to FIG. 1A, the functional blocks of a trimming structure 100 known in the art are schematically shown. The trimming structure 100 is adapted to adjust a plurality of functional parameters of a generic IC, identified as 105.

The IC 105 includes a core circuit 110 whose functioning (not relevant to the present discussion) requires a plurality of operative signals $S(i)$; for the sake of simplicity, FIG. 1A illustrates two of said operative signals only, generically identified as $S(i)$ and $S(i+1)$. Each operative signal $S(i)$ is directly generated inside the IC 105 (i.e., on-chip) by means of a respective operative generator $RG(i)$. For example, the operative signals $S(i)$ are clock signals, and the operative generators $RG(i)$ are clock generator circuits.

Each operative signal $S(i)$ is characterized by one or more functional parameters that may be subjected to variations of their actual values with respect to the expected ones. In the following, for the sake of simplicity, the operative signal and the corresponding functional parameter are identified with the same reference $S(i)$. In case of clock signals, the durations of their clock periods might be considered critical functional parameters for the correct functioning of the IC 105.

In order to tune the functional parameters $S(i)$ to counterbalance said variations and obtaining the desired expected values, each operative generator $RG(i)$ includes a trimming circuit $TC(i)$. The trimming circuit $TC(i)$ is capable of adjusting the functional parameter $S(i)$ in response to a trimming word $TR(i)$; particularly, each value of the trimming word $TR(i)^k$ ($k=-N/2+1$ to $N/2$) defines a different trimming action $TA(i)^k$—implemented by the trimming circuit $TC(i)$—which typically causes a corresponding correction of the functional parameter $S(i)$.

With reference to the specific case of the clock signals, and without descending into circuital details not relevant to the present discussion, each trimming circuit $TC(i)$ includes a delaying element for regulating the clock period, like an RC network. Each RC network includes a resistor $R(i)$, whose resistance can be trimmed in order to vary the clock period of the operative signal $S(i)$. For example, the resistor $R(i)$ includes a plurality of auxiliary resistors $r(i)<j>$ ($j=0$ to $M-1$) that are selectively connectable in parallel to a main resistor $B(i)$ by means of respective controlled switches $SW(i)<j>$; each controlled switch $SW(i)<j>$ is selectively activatable by means of a corresponding digital trimming signal $TR(i)<j>$. Thus, by connecting a selected number of auxiliary resistors $r(i)<j>$ in parallel to the main resistor $B(i)$, the overall resistance of the resistor $R(i)$ can be varied, and thus the clock period of the clock signal $S(i)$ can be adjusted accordingly. The open/closed configuration of the switches $SW(i)<j>$ is determined by the value assumed by the M trimming signals $TR(i)<j>$, which define as a whole the corresponding (M-bit) trimming word $TR(i)$.

The operative signals $S(i)$ are provided outside the IC 105 to a measuring circuit 120, which is adapted to measure the functional parameters thereof (e.g., the clock periods of the clock signals) in such a way to make the results of said measurements available to an operator. Moreover, the measuring circuit 120 is capable of driving each trimming circuit TC(i) individually by setting a configuration code VC(i), which represents a corresponding trimming word TR(i); for example, the configuration code VC(i) includes a word of $\log_2(M)$ bits. Each configuration code VC(i) is provided to the corresponding operative generator RG(i) and is converted into the trimming word TR(i) by a decoder D(i) included therein.

Each configuration code VC(i) can also be permanently stored in the IC 105 by means of a corresponding configuration register M(i), for example, a Read Only Memory (ROM). For this purpose, each configuration register M(i) has an input for receiving the desired configuration code VC(i), and an output for providing it to the corresponding operative generator RG(i).

In the following, an exemplary trimming process making use of the known trimming structure 100 of FIG. 1A will be described. For this purpose, each functional parameter S(i) is subjected to a dedicated "measuring and correcting" procedure.

However, before describing said procedure, it is necessary to illustrate a number of preliminary operations that must be carried out before the manufacturing of the IC 105, i.e., during the IC architectural design.

More particularly, once established the expected value that the functional parameter S(i) has to assume ideally, the first preliminary operation includes defining a correction range thereof (for example, centered around the expected value); this is useful for dimensioning the trimming circuit TC(i), such as the resistor R(i) in the example at issue. The amplitude of the correction range depends on the expected variations of the functional parameter S(i) due to the tolerance of the manufacturing process used for integrating the IC 105: the more mature the process, the narrower the correction range.

The next preliminary operation includes defining the resolution of the trimming circuit TC(i). With the term "resolution" it is intended the number of allowed corrections (N) for the functional parameter S(i) within the above defined correction range, wherein each correction is caused by a corresponding trimming action $TA(i)^k$. In the example at issue, the resolution of the trimming circuit TC(i) depends on the number of auxiliary resistors r(i)<j> that can be connected in parallel to the main resistor B(i). The higher the number of auxiliary resistors r(i)<j>, the finer the overall resistance of the resistor R(i) can be varied, so that the finer the functional parameter S(i) can be trimmed. The amplitude of said resolution depends on the requested accuracy of the functional parameter S(i)—for example, due to its criticality for the correct operation of the IC 105: the more accurate the functional parameter S(i), the higher the resolution.

The last preliminary operation includes associating a trimming word $TR(i)^k$—represented by the corresponding configuration code $VC(i)^k$—with each trimming action $TA(i)^k$ for obtaining the desired correction of the functional parameter S(i).

Figure 1B:
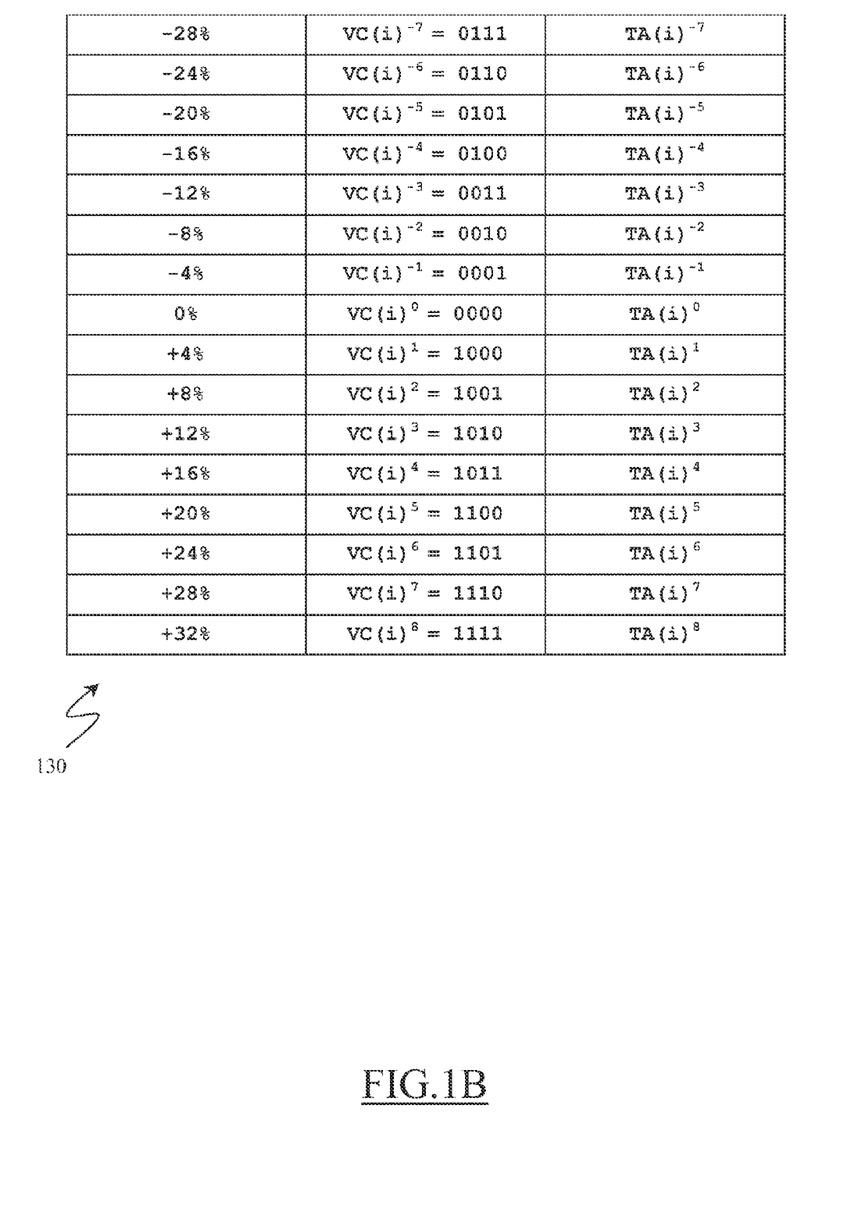
FIG. 1B illustrates an exemplary trimming table that can be used in the structure of FIG. 1A.

FIG. 1B shows an exemplary trimming table 130 including the results obtained by performing the above-mentioned preliminary operations.

According to this example, the correction range of the functional parameter S(i)—in this case, the clock period of the clock signal—is expressed as a percentage, and it extends from −28% to +32% with respect to the desired expected value (corresponding to a correction of 0%). The trimming table 130 includes 16 rows, each one corresponding to a particular trimming action $TA(i)^k$, so that the resolution of the trimming circuit TC(i) is N=16. Assuming a constant difference between each pair of corrections caused by adjacent trimming actions $TA(i)^k$—for example, when all the auxiliary resistors r(i)<j> have the same resistance—the correction range is equally subdivided in 16 parts. In this way, the resolution of the trimming circuit TC(i) expressed as a percentage, equal to the correction range divided by the number N of allowable corrections, is (32−(−28))/16≈4%. In this case, a possible coding of the $16=2^4$ different trimming actions $TA(i)^k$ makes use of a 4-bit configuration code VC(i), from "0111" (corresponding to k=−7) to "1111" (corresponding to k=+8) for corrections of corresponding sign. The trimming table 130 illustrates the association, with the configuration code VC(i) equal to $VC(i)^0$ corresponding to the 0% variation (i.e., corresponding to the expected value).

Once the preliminary operations have been performed, the measuring and correcting procedure is started. For this purpose, the measuring circuit 120 generates the configuration code VC(i), sweeping all the N possible values $VC(i)^k$ thereof in succession, and provides it to the corresponding operative generator RG(i). In this way, the configuration code $VC(i)^k$ is converted into the trimming word $TR(i)^k$ by the decoder D(i) included therein; the trimming word $TR(i)^k$ forces the trimming action $TA(i)^k$, so as to apply the corresponding correction to the functional parameter S(i). The operative signal S(i) is then returned to the measuring circuit 120, so as to measure the actual value reached by its functional parameter in response to the trimming action $TA(i)^k$.

More particularly, at the beginning of the measuring and correcting procedure, the measuring circuit 120 sets the configuration code VC(i) to the value $VC(i)^0$ (i.e., corresponding to the 0% variation with respect the expected value). If the measured functional parameter S(i) does not correspond to the expected value (due to the tolerances of the manufacturing process used for integrating the IC 105), the measuring circuit 120 changes the configuration code VC(i), setting it to another value among those indicated in the trimming table 130, until the expected value is reached (with an acceptable accuracy). Particularly, if the functional parameter S(i) has been ascertained to be higher than the expected value, the measuring circuit 120 reacts by driving the trimming circuit TC(i) so as to lower it (i.e., so as to obtain a negative correction thereof); if instead the functional parameter has been ascertained to be lower than the expected value, the measuring circuit 120 reacts by driving the trimming circuit TC(i) so as to increase it (i.e., so as to obtain a positive correction thereof).

Once the expected value has been reached, the configuration code $VC(i)^k$ corresponding to the trimming action $TA(i)^k$ that has produced the correction capable of counterbalancing the variation of the functional parameter S(i)—due to the tolerances of the manufacturing process—is stored into the configuration register M(i).

All the above-mentioned operations—that is, the preliminary operations for creating the trimming table and the measuring and correcting procedure—are repeated for all the functional parameters S(i) that are reputed to be significant for the correct functioning of the core circuit of the IC. In this way, after all the functional parameters S(i) have been trimmed, each configuration register M(i) stores a corresponding configuration code $VC(i)^k$. The trimming actions $TA(i)^k$ corresponding to the stored configuration codes $VC(i)^k$ then remain the same during all the operative life of the IC 105.

Figure 2:
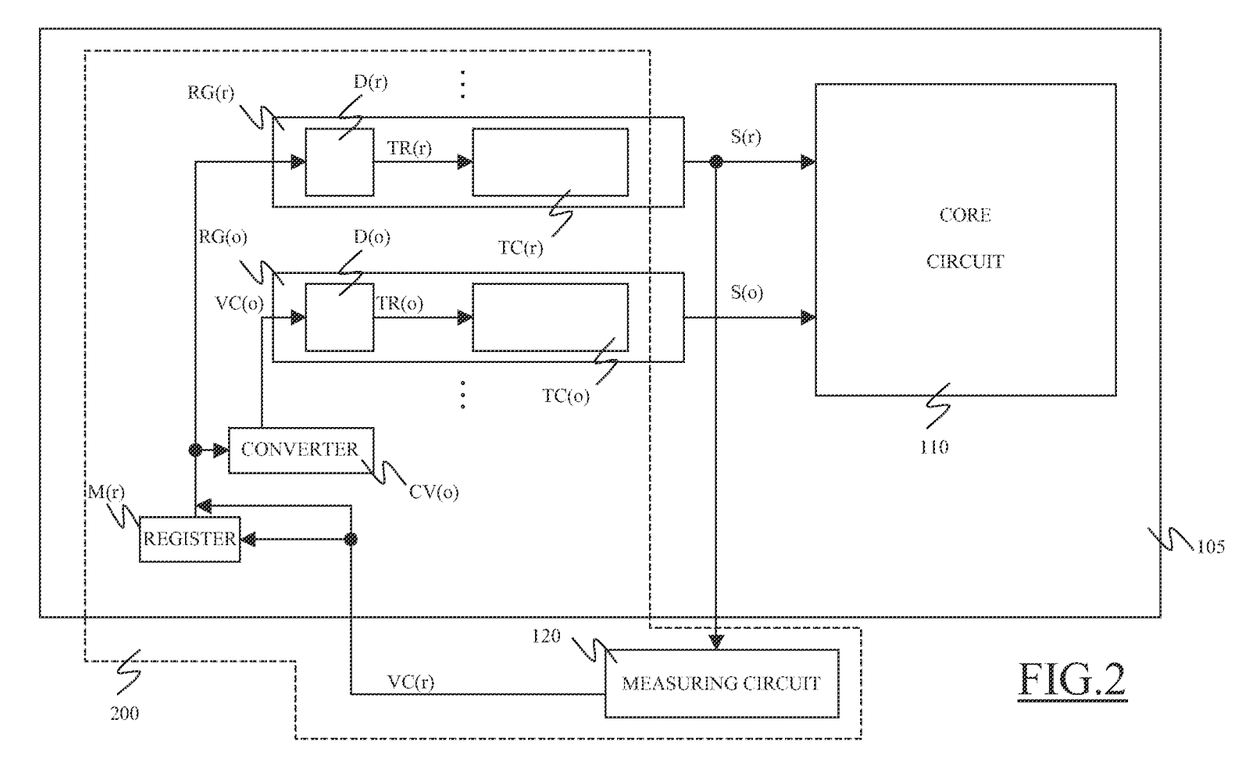
FIG. 2 shows the functional blocks of a trimming structure according to an embodiment of the present disclosure.

Turning now to FIG. 2, the functional blocks of a trimming structure 200 according to an embodiment of the present disclosure are schematically shown. The elements of the trimming structure 200 corresponding to the ones shown in the FIG. 1A are denoted with the same references, and their explanation is omitted for the sake of brevity.

In principle, the proposed trimming structure takes advantage of the fact that all the circuit blocks included in the IC 105 are subjected to steps of a same manufacturing process. In this way, the variations in all the functional parameters to be trimmed are in some way correlated to each other. Therefore, once the above-described trimming and correcting procedure has been accomplished for a subset of chosen functional parameters (from now on identified as "reference" parameters), it is possible to infer the trimming actions needed for correcting the other (non-reference) functional parameters, wherein said inference is based on predetermined relationships relating the effects of the fluctuations in the manufacturing parameters for the reference parameters to the ones for the non-references parameters.

As described in detail in the following, a solution according to an embodiment of the present disclosure maps groups of multiple corrections for the reference parameters onto a corresponding single correction for each non-reference parameter (either by aggregating the different corrections of a single reference parameter or by combining more reference parameters).

An embodiment is of general applicability. Particularly, this technique may avoid measuring whatever functional parameters; this advantage is clearly perceived when these functional parameters are not directly available outside the IC.

More specifically, to an embodiment of disclosure allows trimming the functional parameters with different accuracy. Therefore, it is possible to discriminate functional parameters requiring different trimming processes (for example, because their accuracy is more or less critical for the operation of the IC).

Particularly, in an embodiment of the disclosure a single reference signal, denoted with $S(r)$, is chosen. The reference parameter $S(r)$ chosen may be the most critical one for the functioning of the core circuit 110 and/or as the one that can be measured in the easiest way; for example, a choice may be selecting the clock period of the most accurate clock signal in the IC 105.

In this case, the measuring circuit 120 only receives the reference signal $S(r)$ among the plurality of operative signals that are provided to the core circuit 110. Furthermore, the trimming structure 200 only includes one configuration register, i.e., the configuration register $M(r)$ corresponding to the reference signal $S(r)$.

Regarding instead the other non-reference signals—FIG. 2 illustrates one of said non-reference signals only, generically identified as $S(o)$—the trimming structure 200 includes a converter $CV(o)$ for each one of them. The converter $CV(o)$ has an input terminal connected to the output terminal of the configuration register $M(r)$—for receiving the stored configuration code $VC(r)$ associated with the reference signal $S(r)$—and an output terminal connected to the corresponding operative generator $RG(o)$—for providing the configuration code $VC(o)$ forcing the desired trimming action on the non-reference parameter $S(o)$. As it will be more clear in the following, the configuration code $VC(o)$ is obtained from the configuration code $VC(r)$ according to a relationship relating the corrections of the reference parameter $S(r)$ with the corrections of the non-reference parameter $S(o)$, which relationship is implemented by means of the converter $CV(o)$.

Therefore, the above-described measuring and correcting procedure is performed for the reference parameter $S(r)$ only; as above, the configuration code $VC(r)^k$—corresponding to the trimming action $TA(r)^k$ that has produced the correction capable of counterbalancing the variation of the reference parameter $S(r)$—is stored into the configuration register $M(r)$. During the operative life of the IC 105, the configuration code $VC(r)^k$ is provided directly to the corresponding trimming circuit $TC(r)$, whereas the same configuration code $VC(r)^k$ is decoded into each other configuration code $VC(o)^p$—through the converter $CV(o)$—which is in turn provided to the corresponding trimming circuit $TC(o)$, so as to force the trimming actions causing the desired corrections of all the (reference and non-reference) functional parameters.

Figure 3A:
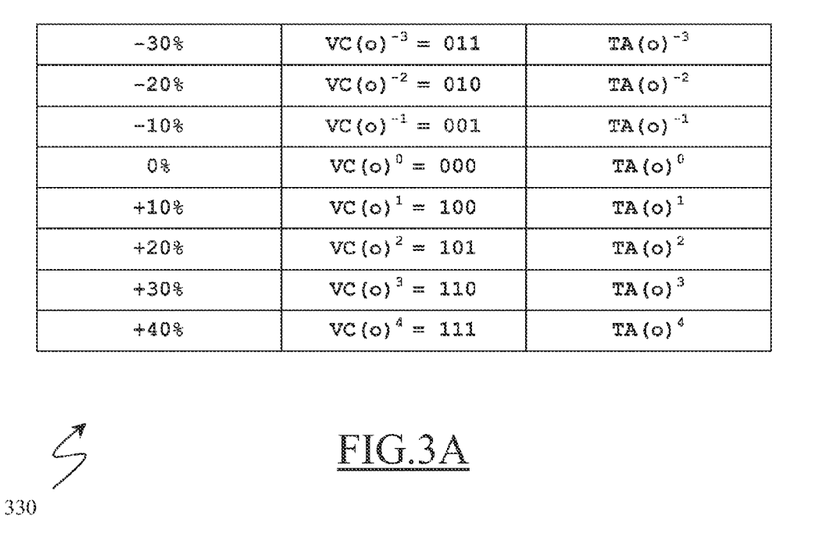
FIG. 3A illustrates a further exemplary trimming table that can be used in the structure of FIG. 2 according to an embodiment of the disclosure.

For the sake of conciseness, it is assumed that the reference signal $S(r)$ is associated with the same trimming table 130 described with reference to the FIG. 1B. FIG. 3A instead shows a further exemplary trimming table 330 regarding the non-reference parameter $S(o)$—for example, the clock period of another clock signal being less critical for the functioning of the IC 105. The trimming circuit associated with the non-reference parameter $S(o)$ likewise includes a resistor $R(o)$ with variable resistance—having a structure that is similar to the resistor $R(i)$ previously described, but with a lower number of auxiliary resistors $r(o)<j>$.

According to this example, the correction range of the non-reference parameter $S(o)$ extends from $-30\%$ to $+40\%$ with respect to the desired expected value corresponding to a variation of $0\%$. The trimming table 330 includes $P=8$ rows, each one corresponding to a particular trimming action $TA(o)^p$ ($p=-P/2+1$ to $P/2$). The resolution of the trimming circuit $TC(o)$ expressed as a percentage is then equal to $(40-(-30))/8 \approx 10\%$. In this case, a possible coding of the $8=2^3$ different variations makes use of a 3-bit configuration code $VC(o)$. The trimming table 330 illustrates said association, with the configuration code $VC(o)$ equal to $VC(o)^0$ corresponding to the $0\%$ variation.

Figure 3B:
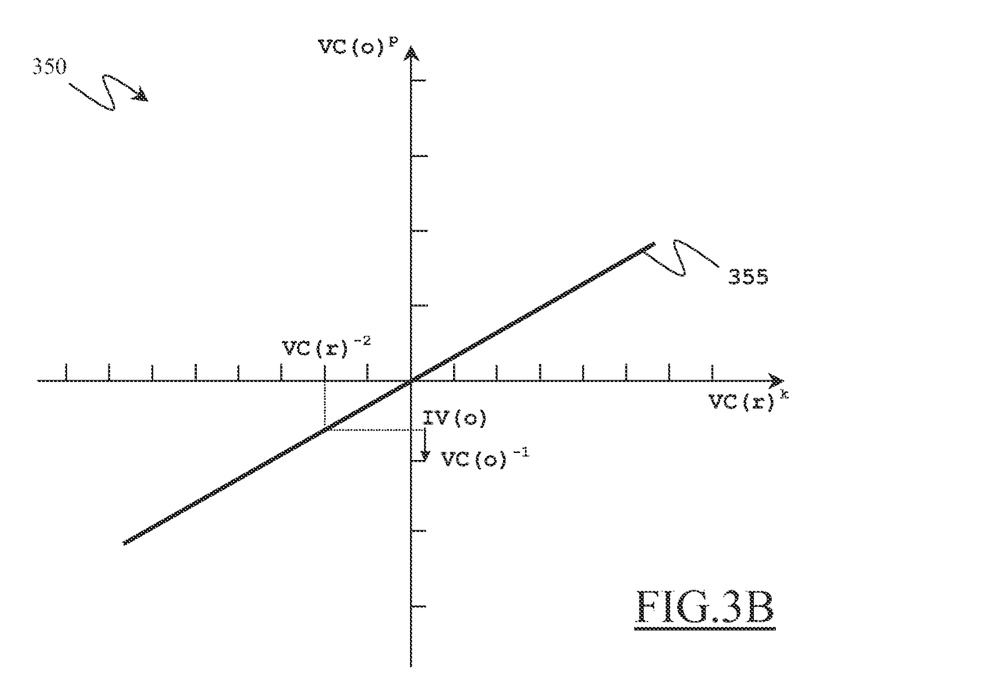
FIG. 3B is a diagram representing an exemplary relationship between two different functional parameters to be trimmed according to an embodiment of the disclosure.

In order to explain how the converter is capable of obtaining the configuration code $VC(o)$ from the configuration code $VC(r)$, reference will be now made to FIG. 3B.

More particularly, this figure illustrates a diagram 350 representing the relationship between all the possible corrections of the reference parameter $S(r)$ (to counterbalance corresponding variations caused by the fluctuations of the manufacturing process) and all the possible corrections of the non-reference parameter $S(o)$ (to counterbalance corresponding variations caused by the same fluctuations of the manufacturing process). The diagram 350 has an abscissa axis, representing the corrections of the reference parameter $S(r)$, and an ordinate axis, representing the corrections of the non-reference parameter $S(o)$. In the example at issue, i.e., with both the reference parameter $S(r)$ and the non-reference parameter $S(o)$ that are clock periods, the relationship is linear, and is represented by a straight line 355. This means that any variation of the reference parameter $S(r)$ produces a proportional variation for the non-reference parameter $S(o)$—typically, substantially the same. In other words, if the reference parameter $S(r)$ experiences a certain variation (for example, $+10\%$), a corresponding, substantially similar, $+10\%$ variation is experienced by the non-reference parameter $S(o)$ as well.

The abscissa axis specifies all the possible 16 corrections that may be applied to the reference parameter $S(r)$—caused by the trimming actions $TA(r)^k$ forced by the different values of the configuration code $VC(r)^k$; likewise, the ordinate axis specifies all the possible 8 corrections that may be applied to the non-reference parameter $S(o)$—caused by the trimming actions $TA(o)^p$ forced by the different values of the configuration code $VC(o)^p$.

The operation of the converter associated with the non-reference parameter $S(o)$ consists of receiving the value of the configuration code $VC(r)^k$ stored in the configuration register of the reference parameter S(r)—as chosen beforehand through the measuring and correcting procedure—and converting it into the value of the configuration code VC(o)$^p$ that better approximates the value corresponding to the configuration code VC(r)$^k$ according to the above-described relationship. More in detail, starting from the correction caused by the configuration code VC(r)$^k$, a corresponding intermediate (or correction) value—denoted with IV(o)—is determined on the line 355; this intermediate value IV(o) represents the (ideal) correction that should have to be applied to the non-reference parameter S(o). The intermediate value IV(o) is then approximated to the closest (actual) correction that is available for the non-reference parameter S(o). The configuration code VC(o)$^p$ causing said correction is then matched with the configuration code VC(r)$^k$.

For example, if the configuration code for the reference parameter S(r) is VC(r)$^{-2}$="0010"—corresponding to a correction of −8% triggered by the trimming action TA(r)$^{-2}$—the configuration code selected by the converter CV(o) for the non-reference parameter S(o) is VC(o)$^{-1}$="001"—corresponding to a correction of −10% triggered by the trimming action TA(o)$^{-1}$.

Figure 3C:
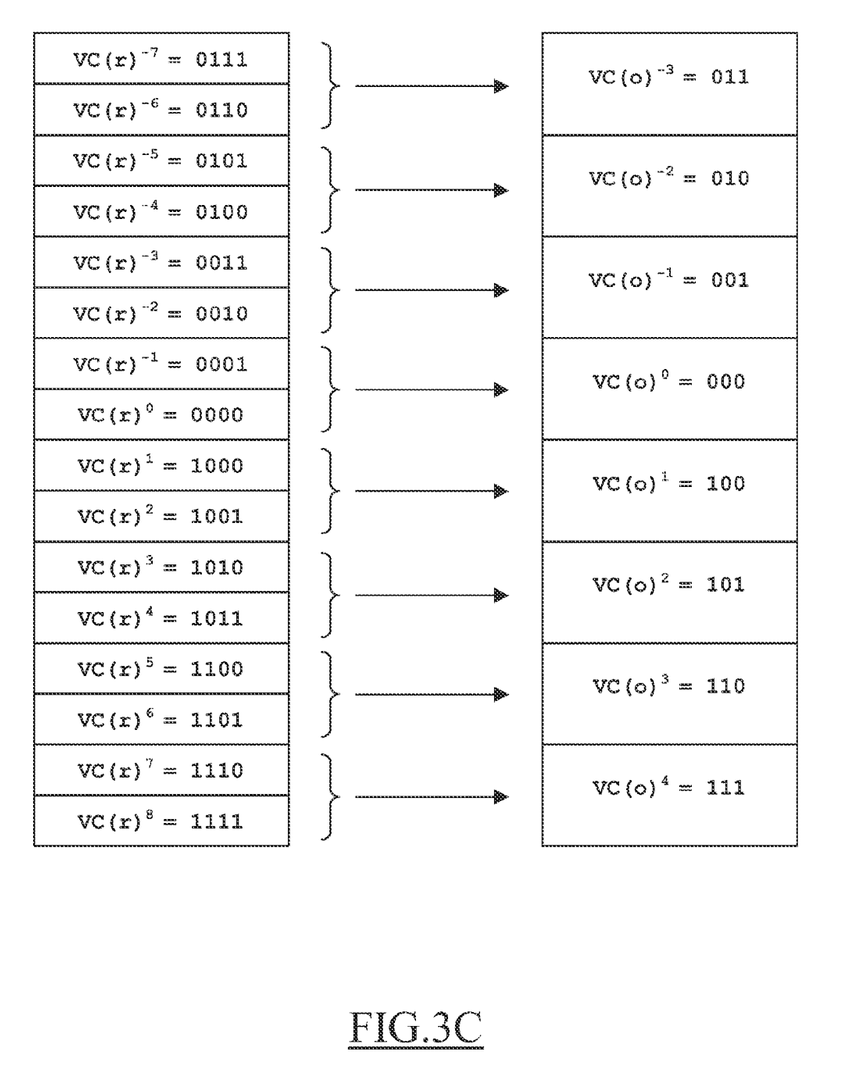
FIG. 3C illustrates an exemplary mapping between the two functional parameters of FIG. 3B according to an embodiment of the disclosure.

FIG. 3C illustrates the resulting mapping of the corrections of the configuration code VC(r)—in the trimming table 130 of FIG. 1B—on the corrections of the configuration code VC(o)—in the trimming table 330 of FIG. 3A. As can be seen, since in the example at issue the resolution of the reference parameter S(r) is higher than that of the non-reference parameter S(o)—i.e., 16 and 8, respectively—each group of (in this case, two) adjacent configuration codes VC(r)$^k$, VC(r)$^{k+1}$ for the reference parameter S(r) is mapped on a single configuration code VC(o)$^p$ for the non-reference parameter S(o).

Figure 4A:
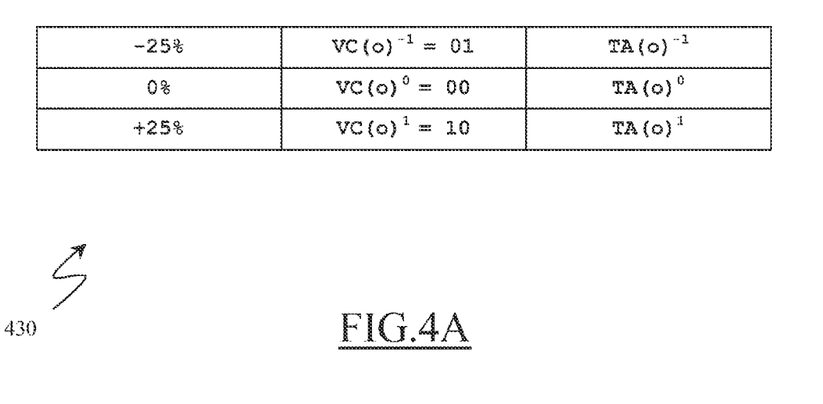
FIG. 4A illustrates a still further exemplary trimming table that can be used in the structure of FIG. 2 according to an embodiment of the disclosure.

In another application of the above-described embodiment, the non-reference parameter S(o) is a delay period generated by a delay line. An exemplary trimming table 430 regarding said non-reference parameter S(o) is illustrated in FIG. 4A.

According to this further example, the correction range of the non-reference parameter S(o) extends from −25% to +25% with respect to the desired expected value corresponding to a variation of 0%. The trimming table 430 includes 3 rows, each one corresponding to a particular trimming action TA(o)$^p$ (p=−1 to 1). The resolution of the trimming circuit TC(o) expressed as a percentage is now equal to (25−(−25))/3≈18%. In this case, a possible coding of the 3 different corrections makes use of a 2-bit configuration code VC(o). The trimming table 430 illustrates said association, with the configuration code VC(o) equal to VC(o)$^0$ corresponding to the 0% variation.

Figure 4B:
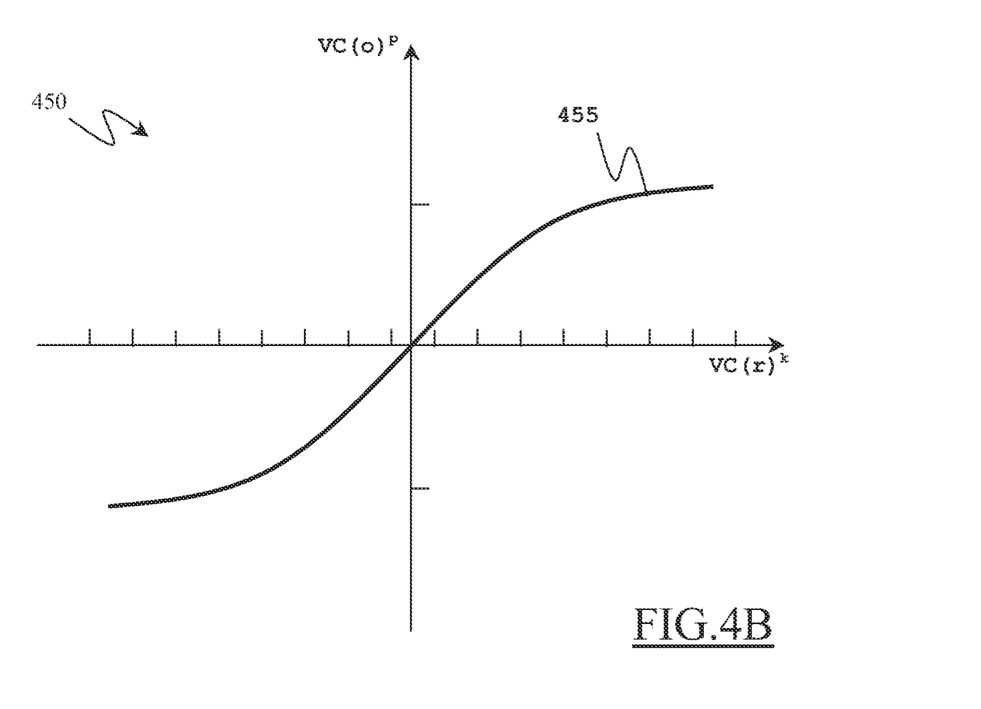
FIG. 4B is a diagram representing another exemplary relationship between two different functional parameters to be trimmed according to an embodiment of the disclosure.

In order to explain how the converter obtains the configuration code VC(o) from the configuration code VC(r), reference will be now made to FIG. 4B.

More particularly, this figure illustrates a diagram 450 again representing the relationship between all the possible corrections of the reference parameter S(r) and all the possible corrections of the non-reference parameter S(o). However, in the example at issue wherein the reference parameter S(r) is a clock period and the non-reference parameter S(o) is a delay period, the relationship is now non-linear, and it is represented by a curve 455. As above, the abscissa axis specifies all the possible 16 corrections that may be applied to the reference parameter S(r), whereas the ordinate axis now specifies all the possible 3 corrections that may be applied to the non-reference parameter S(o).

Figure 4C:
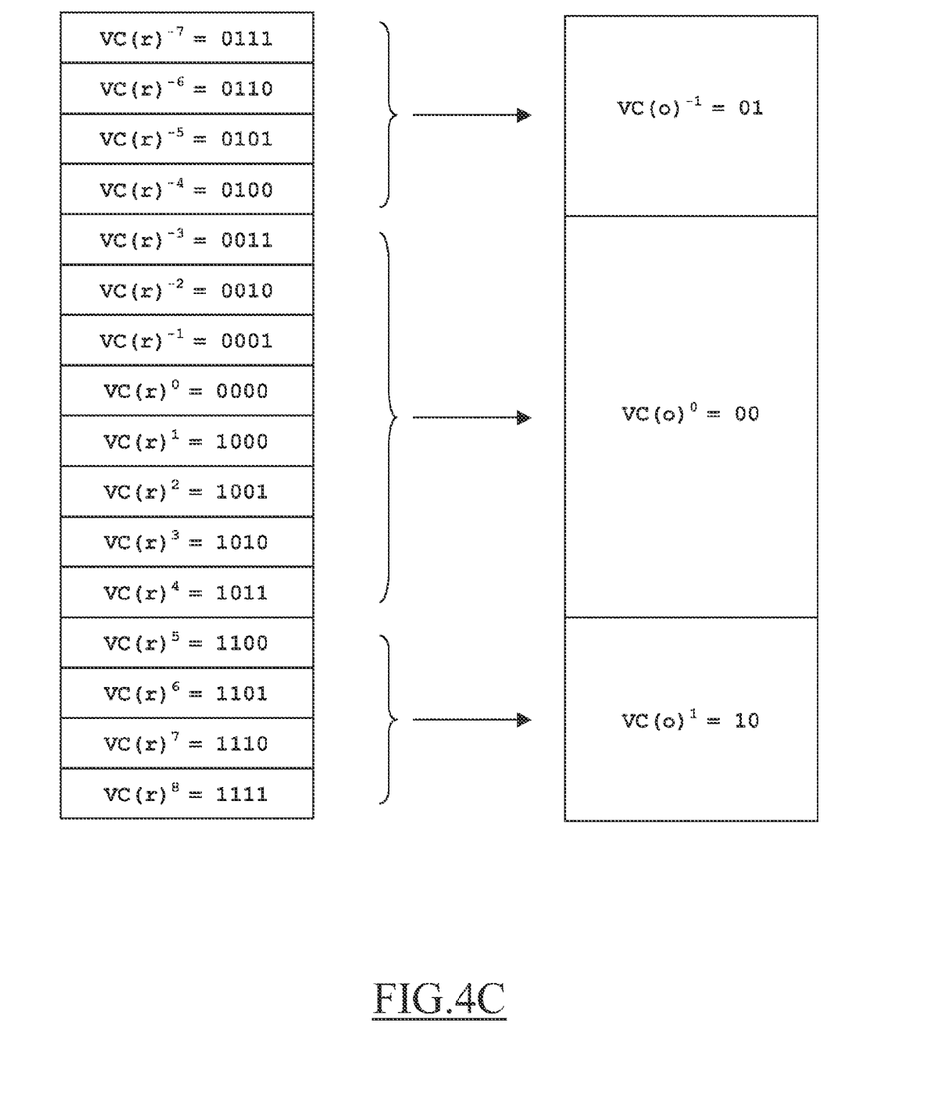
FIG. 4C illustrates an exemplary mapping between the two functional parameters of FIG. 4B according to an embodiment of the disclosure.

FIG. 4C illustrates the resulting mapping of the corrections of the configuration code VC(r)—in the trimming table 130 of FIG. 1B—on the corrections of the configuration code VC(o)—in the trimming table 430 of FIG. 4A. As can be seen, a group of 8 configuration codes (from VC(r)$^{-3}$ to VC(r)$^{+4}$) is mapped on the configuration code VC(o)$^0$, while two groups of 4 configuration codes (one including the configurations codes from VC(r)$^{-7}$ to VC(r)$^{-4}$ and one including the configurations codes from VC(r)$^5$ to VC(r)$^8$) are mapped on the configuration codes VC(o)$^{-1}$ and VC(o)$^{+1}$, respectively.

Figure 5A:
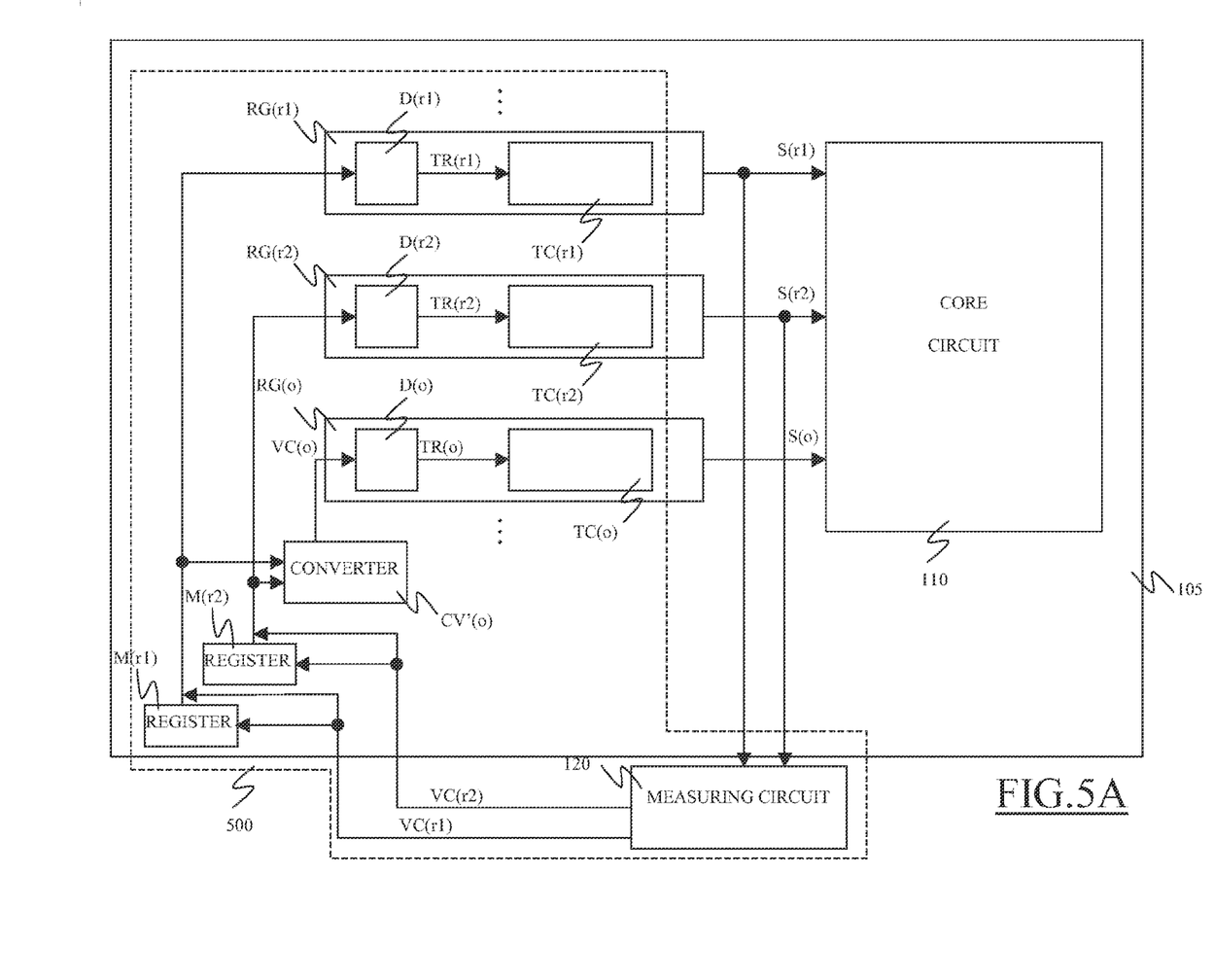
FIG. 5A shows the functional blocks of a trimming structure according to a further embodiment of the present disclosure.

Referring now to FIG. 5A, the functional blocks of a trimming structure 500 according to an embodiment of the present disclosure are schematically shown. The elements of the trimming structure 500 corresponding to the ones shown in the FIGS. 1A and 2 are denoted with the same references, and their explanation is omitted for the sake of brevity.

More particularly, according to this embodiment of the disclosure a pair of reference signals, denoted with S(r1) and S(r2), are chosen (for example, consisting of two different clock signals). In this case, the measuring circuit 120 receives said two reference signals S(r1) and S(r2) among the plurality of operative signals that are provided to the core circuit 110. Furthermore, the trimming structure 500 now includes two configuration registers, i.e., the configuration register M(r1) corresponding to the reference signal S(r1) and the configuration register M(r2) corresponding to the reference signal S(r2).

Regarding instead the other non-reference signals—FIG. 5A illustrates one of said non-reference signals only, generically identified as S(o)—the trimming structure 500 again includes a converter CV'(o) for each one of them. However, in this case the converter CV'(o) has a first input terminal connected to the output terminal of the configuration register M(r1)—for receiving the stored configuration code VC(r1) associated with the reference signal S(r1)—and a second input terminal connected to the output terminal of the configuration register M(r2)—for receiving the stored configuration code VC(r2) associated with the reference signal S(r2); as above, the converter CV'(o) as an output terminal connected to the corresponding operative generator RG(o)—for providing the configuration code VC(o) forcing the desired trimming action on the non-reference parameter S(o). The configuration code VC(o) is likewise obtained from the configuration codes VC(r1) and VC(r2) according to a relationship relating the corrections of the reference parameters S(r1) and S(r2) with the corrections of the non-reference parameter S(o), which relationship is implemented by means of the converter CV'(o).

Figure 5B:
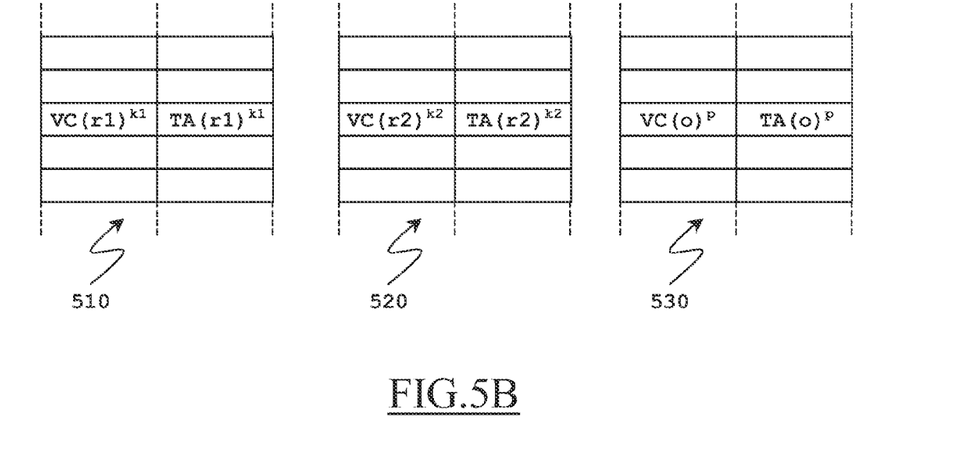
FIG. 5B illustrates exemplary trimming tables for three different functional parameters that can be used in the structure of FIG. 5A according to an embodiment of the disclosure.

FIG. 5B illustrates two exemplary trimming tables 510, 520 of the reference parameters S(r1), S(r2) and an exemplary trimming table 530 of the non-reference parameter S(o). For the sake of conciseness, said trimming tables are not described in detail, being similar to those described above. Each generic row of the trimming tables 510, 520, 530 indicates a trimming action TA(r1)$^{k1}$, TA(r2)$^{k2}$, TA(o)$^p$ corresponding to a configuration code VC(r1)$^{k1}$, VC(r2)$^{k2}$, VC(o)$^p$, respectively.

Figure 5C:
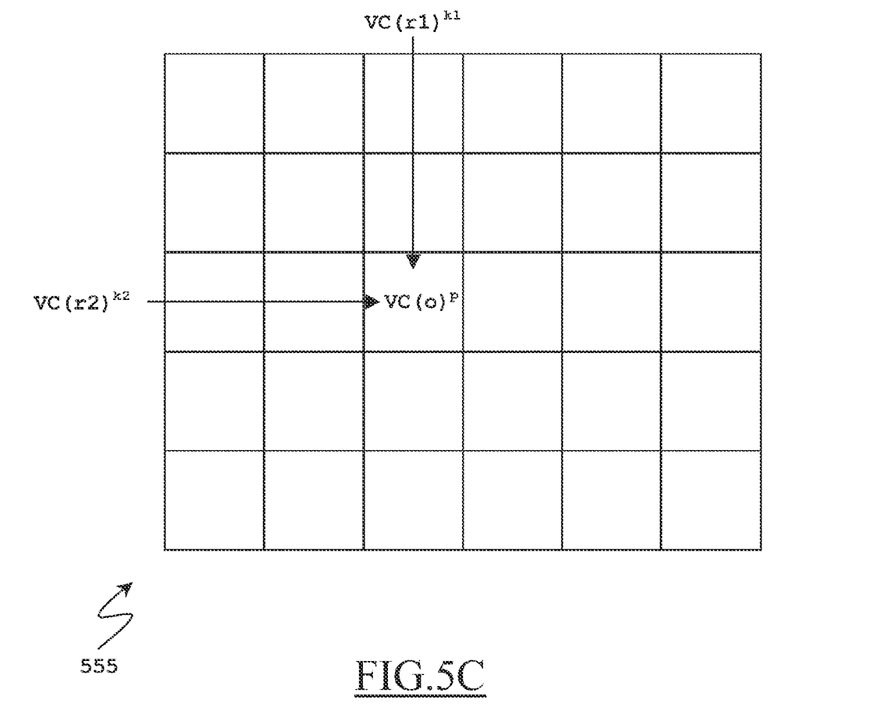
FIG. 5C is a matrix representing an exemplary mapping between the three functional parameters of FIG. 5B according to an embodiment of the disclosure.

In order to explain how the converter obtains the configuration code VC(o) from the configuration codes VC(r1) and VC(r2), reference will be now made to FIG. 5C.

More particularly, FIG. 5C shows a matrix 555 representing the mapping of the corrections of the configuration codes VC(r1),VC(r2)—in the trimming tables 510, 520—on the corrections of the configuration code VC(o)—in the trimming table 530; more in detail, the matrix 555 associates each pair of possible values of the configuration codes VC(r1)$^{k1}$, VC(r2)$^{k2}$ with a possible value of the configuration codes VC(o)$^p$.

The operation of the converter associated with the non-reference parameter S(o) includes receiving the value of the configuration codes VC(r1)$^{k1}$ and VC(r2)$^{k2}$ stored in the configuration registers of the reference parameters S(r1) and S(r2), respectively—as chosen beforehand through the measuring and correcting procedure—and converting them into the value of the configuration code VC(o)P that better approximates the value corresponding to the pair of configuration codes $VC(r1)^{k1}$, $VC(r2)^{k2}$ according to a predefined relationship. More in detail, an intermediate value is determined by combining the corrections caused by the configuration codes $VC(r1)^{k1}$ and $VC(r2)^{k2}$—for example, as their average; this intermediate value represents the (ideal) correction that should have to be applied to the non-reference parameter S(o). The intermediate value is then approximated to the closest (actual) correction that is available for the non-reference parameter S(o). The configuration code $VC(o)^p$ causing the correction is then matched with the pair of configuration codes $VC(r1)^{k1}, VC(r2)^{k2}$.

The above-described embodiment of the disclosure allows modeling whatever relationships between two (or more) reference parameters and each non-reference parameter; this allows taking into account more factors that may impact any functional parameter of the IC.

Moreover, the same technique may be advantageously exploited to increase the accuracy of the proposed solution; for example, it is possible to determine the trimming action for every non-reference parameter according to trimming actions applied to multiple reference parameters of the same type (such as clock periods), so as to reduce the effects of any inaccuracy in the corresponding mapping.

Naturally, in order to satisfy local and specific requirements, a person skilled in the art may apply to the embodiments described above many modifications and alterations. Particularly, although the present disclosure has been described with a certain degree of particularity with reference to embodiments thereof, it should be understood that various omissions, substitutions and changes in the form and details as well as other embodiments are possible; moreover, it is expressly intended that specific elements and/or method steps described in connection with any disclosed embodiment of the disclosure may be incorporated in any other embodiment as a general matter of design choice.

For example, similar considerations apply if the electronic device has a different structure or includes equivalent components. Moreover, although the proposed solution has been specifically designed for ICs, nothing prevents its application to any other type of electronic devices (for example, multi-chip packages). Of course, the examples described above (i.e., the operative signals, their functional parameters, the numerical values of the correction ranges, resolutions, corrections, trimming words and/or configuration codes) are merely illustrative. In any case, similar considerations apply to equivalent measuring and correcting procedures (for example, always involving the application of all the possible trimming actions for each reference parameter). Likewise, any other structure may be used to force the application of the desired trimming action (for example, by working at the level of the trimming words directly, without any configuration code).

The choice of generating the configuration codes for the non-reference parameters starting from the one being stored for the reference parameter(s) allows exploiting advantages of embodiments of the disclosure at their best; however, an embodiment of the disclosure also includes an implementation wherein the same technique is used only to avoid repeating the measuring operations for the non-reference parameters—i.e., calculating the corresponding configuration codes from the ones for the reference parameter(s) and then storing these values in respective configuration registers as usual.

Moreover, nothing prevents applying an embodiment to reference and non-reference parameters having the same resolution.

It is emphasized that the above-described relationships are not comprehensive; for example, the mapping may be based on a linear relationship being decreasing, on a quadratic relationship, on a logarithmic relationship, and so on.

Alternatively, it is possible to use three or more reference parameters (for the other non-reference parameters).

In this case as well, the corrections for the (multiple) reference parameters may be combined with other formulas (for example, based on their weighed average, squared mean value, and so on).

Similar considerations apply if the correction for each non-reference parameter is obtained in a different way from the intermediate value resulting from the correction of the reference parameter(s)—for example, by rounding it.

An embodiment of the present disclosure lends itself to be put into practice even by choosing any other characteristics of the clock signals (such as their skewness), or more generally any other reference parameters (such as delays, resistances, capacitances, and so on).

Although an embodiment of the disclosure may be particularly advantageous for non-reference parameters that cannot be measured outside the IC, nothing prevents application of this or other embodiments to any functional parameter (even when it may be measured).

An IC such as the IC 105 may be coupled to a controller, and the IC and controller may form part of a system such as a cell phone or computing system.

The invention claimed is:

1. An electronic device, comprising:
   a trimming circuit for applying a plurality of trimming actions to each of a plurality of parameters, each trimming action causing a corresponding correction of each respective parameter;
   a measuring circuit for measuring at least one parameter as a reference parameter in response to the application of at least one of the trimming actions such that the at least one trimming action provides a target value of the reference parameter;
   a selection circuit configured to select a trimming action for each non-reference parameter different from the at least one reference parameter, and further operable to select one of the trimming actions for the non-reference parameter corresponding to the selected trimming action for the at least one reference parameter according to a mapping of each group of multiple corrections of the at least one reference parameter on a single correction of the non-reference parameter;
   a biasing circuit for forcing the application of the selected trimming action for the reference parameter and for forcing the application of the selected trimming action for each non-reference parameter;
   a storage circuit for storing a code in the electronic device for each reference parameter that is indicative of the selected trimming action for the reference parameter; and
   a conversion circuit for converting the code for the at least one reference parameter into a code for each non-reference parameter that is indicative of the selected trimming action for the non-reference parameter.

2. The electronic device according to claim 1, wherein the at least one reference parameter comprises a single reference parameter, wherein the number of the trimming actions for the reference parameter is higher than the number of the trimming actions for each non-reference parameter.

3. The electronic device according to claim 1, wherein the selection circuit is configured to select the trimming action for the non-reference parameter that corresponds to the correction for the non-reference parameter related to a conversion value associated with the correction corresponding to the selected trimming action for the reference parameter according to a relationship between the corrections for the reference parameter and the corrections for the non-reference parameter.

4. The electronic device according to claim 3, wherein the relationship comprises a linear relationship.

5. The electronic device according to claim 3, wherein the selection circuit is configured to select the trimming action for the non-reference parameter that corresponds to the correction for the non-reference parameter related to a conversion value associated with a combination of the corrections corresponding to the selected trimming actions for the reference parameters according to a relationship between the corrections for the reference parameter and the corrections for the non-reference parameter.

6. The electronic device according to claim 5, wherein the relationship comprises a linear relationship.

7. The electronic device according to claim 1, wherein the at least one reference parameter comprises a plurality of reference parameters.

8. The electronic device according to claim 1, wherein the selection circuit is configured to select the trimming action for the non-reference parameter according to an approximation of the conversion value to the closest correction for the non-reference parameter.

9. The electronic device according to claim 1, wherein the at least one reference parameter includes a characteristic of a clock signal of the electronic device.

10. The electronic device according to claim 1, wherein each non-reference parameter is not measurable from outside the electronic device.

11. An electronic device, comprising:
a trimming circuit configured to apply a plurality of trimming actions to each of a plurality of parameters, each trimming action causing a corresponding correction of each respective parameter;
a measuring circuit configured to measure at least one parameter as a reference parameter in response to at least one trimming action such that the at least one trimming action provides a target value of the reference parameter;
a selection circuit configured to select a trimming action for each non-reference parameter different from the at least one reference parameter, and further configured to select one of the trimming actions for the non-reference parameter corresponding to the selected trimming action for the at least one reference parameter according to a mapping of each group of multiple corrections of the at least one reference parameter on a single correction of the non-reference parameter;
a biasing circuit configured to force the application of the selected trimming action for the reference parameter and configured to force the application of the selected trimming action for each non-reference parameter; and
a storage circuit configured to store a code in the electronic device for each reference parameter that is indicative of the selected trimming action for the reference parameter.

12. The electronic device of claim 11, further comprising a conversion circuit configured to convert the code for the at least one reference parameter into a code for each non-reference parameter that is indicative of the selected trimming action for the non-reference parameter.

13. The electronic device of claim 11, wherein the at least one reference parameter comprises a single reference parameter, wherein the number of the trimming actions for the reference parameter is higher than the number of the trimming actions for each non-reference parameter.

14. The electronic device according to claim 11, wherein the selection circuit is configured to select the trimming action for the non-reference parameter that corresponds to the correction for the non-reference parameter related to a conversion value associated with the correction corresponding to the selected trimming action for the reference parameter according to a relationship between the corrections for the reference parameter and the corrections for the non-reference parameter.

15. The electronic device according to claim 14, wherein the relationship comprises a linear relationship.

16. An electronic device, comprising:
a trimming circuit configured to apply a plurality of trimming actions to each of a plurality of parameters, each trimming action causing a corresponding correction of each respective parameter;
a measuring circuit configured to measure at least one parameter as a reference parameter in response to at least one trimming action such that the at least one trimming action provides a target value of the reference parameter;
a selection circuit configured to select a trimming action for each non-reference parameter different from the at least one reference parameter, and further configured to select one of the trimming actions for the non-reference parameter corresponding to the selected trimming action for the at least one reference parameter according to a mapping of each group of multiple corrections of the at least one reference parameter on a single correction of the non-reference parameter;
a biasing circuit configured to force the application of the selected trimming action for the reference parameter and configured to force the application of the selected trimming action for each non-reference parameter; and
a conversion circuit configured to convert a first code for the at least one reference parameter into a second code for each non-reference parameter that is indicative of the selected trimming action for the non-reference parameter.

17. The electronic device of claim 16, further comprising a storage circuit configured to store the first code in the electronic device for each reference parameter that is indicative of the selected trimming action for the reference parameter.

18. The electronic device of claim 16, wherein the at least one reference parameter comprises a single reference parameter, wherein the number of the trimming actions for the reference parameter is higher than the number of the trimming actions for each non-reference parameter.

19. The electronic device according to claim 16, wherein the selection circuit is configured to select the trimming action for the non-reference parameter that corresponds to the correction for the non-reference parameter related to a conversion value associated with the correction corresponding to the selected trimming action for the reference parameter according to a relationship between the corrections for the reference parameter and the corrections for the non-reference parameter.

20. The electronic device according to claim 19, wherein the relationship comprises a linear relationship.

* * * * *